United States Patent
Van Der Vleuten

(10) Patent No.: US 7,421,138 B2
(45) Date of Patent: Sep. 2, 2008

(54) DATA COMPRESSION AND EXPANSION OF A DIGITAL INFORMATION SIGNAL

(75) Inventor: Renatus Josephus Van Der Vleuten, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 709 days.

(21) Appl. No.: 10/502,175

(22) PCT Filed: Dec. 18, 2002

(86) PCT No.: PCT/IB02/05511

§ 371 (c)(1),
(2), (4) Date: Jul. 21, 2004

(87) PCT Pub. No.: WO03/063359

PCT Pub. Date: Jul. 31, 2003

(65) Prior Publication Data

US 2005/0073449 A1 Apr. 7, 2005

(30) Foreign Application Priority Data

Jan. 23, 2002 (EP) .................................. 02075298

(51) Int. Cl.
*G06K 9/36* (2006.01)
*H03M 7/00* (2006.01)
*G06K 9/46* (2006.01)

(52) U.S. Cl. ...................................... 382/244; 341/107
(58) Field of Classification Search ................. 382/232, 382/233, 238, 244, 236, 247, 260–264, 284; 375/240.12, 240.27, 240.29; 341/106, 107; 358/426, 429; 704/500

See application file for complete search history.

(56) References Cited

U.S. PATENT DOCUMENTS

| 6,229,463 B1 * | 5/2001 | Van Der Vleuten et al. . 341/107 |
| 6,269,338 B1 * | 7/2001 | Bruekers et al. ............ 704/500 |
| 6,778,965 B1 * | 8/2004 | Bruekers et al. ............ 704/500 |
| 2005/0073449 A1 * | 4/2005 | Van Der Vleuten ......... 341/107 |

* cited by examiner

*Primary Examiner*—Amir Alavi
(74) *Attorney, Agent, or Firm*—Michael E. Belk

(57) ABSTRACT

A data compression apparatus receives a digital information signal, determines a probability signal from the digital information signal and at least one previously determined value of the probability signal, entropy encodes the digital information signal into a compressed digital information signal, in response to the probability signal, and transmits or records the compressed signal. Also, a data expansion apparatus receives the compressed signal and entropy decodes the compressed signal into a expanded replica of the digital information signal, in response to a second probability signal determined from the replica and at least one previously determined value of the second probability signal. Thus, complex division operations can be avoided.

16 Claims, 3 Drawing Sheets

DATA COMPRESSION AND EXPANSION OF A DIGITAL INFORMATION SIGNAL

Figure 1:
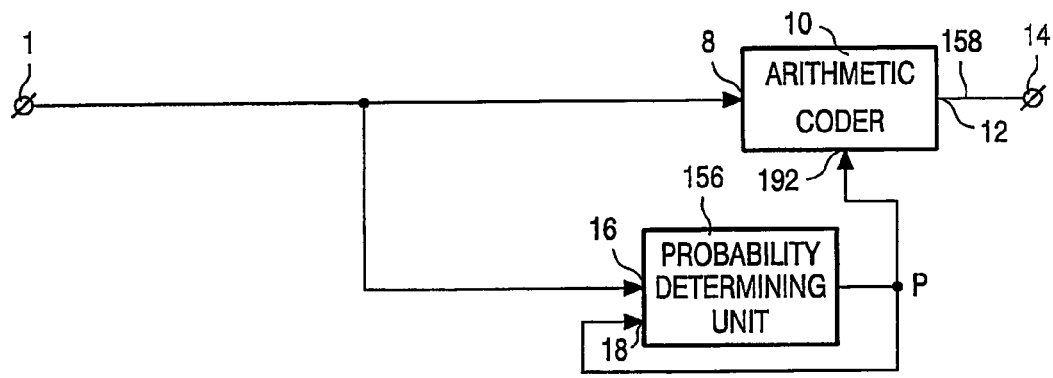

The invention relates to a data compression apparatus for data compressing a digital information signal. The data compression apparatus comprises input means for receiving the digital information signal, probability signal determining means for determining a probability signal from the digital information signal, entropy encoding means for entropy encoding the digital information signal in response to said probability signal so as to obtain a data compressed digital information signal, and output means for supplying the data compressed digital information signal.

The invention further relates to a data compression method, a transmitter comprising the data compression apparatus, a recording apparatus comprising the data compression apparatus, a record carrier having the data compressed digital information signal recorded on it in a track of said record carrier, to a data expansion apparatus for data expanding a data compressed digital information signal, to a data expansion method, a receiver comprising the data expansion apparatus and to a reproducing apparatus comprising the data expansion apparatus.

Data compression on a digital information signal is well known in the art. Reference is made in this respect to WO 98/16014. The document describes a data compression apparatus for data compressing an audio signal. The audio signal is in the form of a bit stream signal. The apparatus comprises an arithmetic encoder and a probability determining unit. The probability determining unit determines a probability value indicating the probability that a bit in the bit stream signal received has a predetermined logical value, such as '1'. The arithmetic coder encodes the bit stream signal into a data compressed bit stream signal in response to probability values p supplied to its input.

Arithmetic coding is a well-known technique for entropy coding. For an introduction to arithmetic coding, the reader may consult e.g. [Moff98, Penn93, Witt87, Lang84]. When given an input symbol and associated probability information, the arithmetic encoder can compress the input symbol very closely to the theoretical lower limit, known as the entropy. A lot of research has been performed on the efficient implementation of arithmetic coding, trying to find the best balance between the complexity of the implementation and the compression efficiency (i.e. how close the efficiency is to the theoretical limit). A particularly efficient low-complexity solution was given in [Vleu00, Vleu99].

The above-mentioned probability information is obtained from the model Based on certain assumptions about the input symbols to be compressed, the model derives the probability distributions of the symbols and provides the probability information together with the symbol to the arithmetic coder (and decoder). For example, models for the case of binary audio signal compression are given in [Vleu98b, Vleu98a, Vleu01].

A popular model for general binary data, used e.g. in [Dutt95, Moff98] is to estimate the probability as $$P(0) = \frac{C(0) + \Delta}{C(0) + C(1) + 2\Delta}, \quad (1)$$

where $P(0)$ is the probability of the next bit being a zero, $C(0)$ is the number of zero-bits that have been observed, $C(1)$ is the number of one-bits that have been observed, and $\Delta$ is a constant to provide an initial estimate when no data has been observed yet; typically $\Delta=0.5$ or $\Delta=1$. The estimation of (1) implicitly assumes that the bit sequence to be compressed is stationary. In practice, however, the statistics will change dependent on the position in the bit sequence. Therefore, often a scaling is applied to the bit counts $C(0)$ and $C(1)$ [Dutt95]. For example, when either $C(0)$ or $C(1)$ or $C(0)+C(1)$ reaches a certain value, both $C(0)$ and $C(1)$ could simply be divided by two. By the particular choice of the value that triggers the scaling a trade-off can be made between faster or slower adaptation to changing statistics and the accuracy of the probability estimation. Finally, a practical implementation of arithmetic coding often uses multiple contexts (see e.g. [Dutt95]); the probabilities are then determined separately for each different context by using different counters $C(0)$ and $C(1)$ for each context and using these counts according to (1) to obtain a separate $P(0)$ for each context.

Thus, as is clear from (1), obtaining the estimated probability requires a division. This significantly increases the complexity of the implementation of arithmetic coding, in particular in hardware. In fact, a lot of research has been done on multiplication-free implementations of arithmetic coding (see e.g. [Vleu00]) and the complexity of a division is even much higher than the complexity of a multiplication. Therefore, removing this division is essential for obtaining an efficient implementation.

A known solution to remove the division is to integrate the probability estimation and the arithmetic coding engine, as is done for the Q-Coder [Penn88, Dutt95]. However, the disadvantage of this approach is that only a limited set of probabilities can be used (to limit the size of the look-up tables needed to implement the model), which affects the compression efficiency of the arithmetic coding implementation. Furthermore, it makes the model inflexible. An other known solution, which uses the symbol counts (so the model is still flexible) but still approximates the probabilities, is disclosed in [Riss89, Mohi87]. However, the probability approximation reduces the efficiency of the compression method.

The invention aims at providing a data compression/expansion apparatus for data compressing/expansion a digital information signal having an efficient implementation.

The data compression apparatus in accordance with the invention characterized in that the probability signal determining means is adapted for determining a new value P of the probability signal from the digital information signal and at least one previously determined value of the probability signal.

By using at least one previously determined value p of the probability signal to determine a new value P a complex division could be eliminated. A complex division is a division by a variable or a division by a constant having a value$\neq 2^m$, m being an integer>0. The basic idea is to compute the probability estimation by a "running-average" filter operation instead of by counting the symbol frequencies. This computation can be implemented using simple shift and add operations and is thus free of complex divisions. The method to determine the probability value P in accordance to the invention can be easily combined with many arithmetic coding implementations and fits particularly well to our previous solution for multiplication-free arithmetic coding [Vleu00]. When the two solutions are combined, an efficient adaptive arithmetic coding implementation is obtained that is free of multiplications and divisions.

Another advantage of the method in accordance to the invention is that no prediction filter is needed as disclosed in WO 98/16014.

Figure 2:
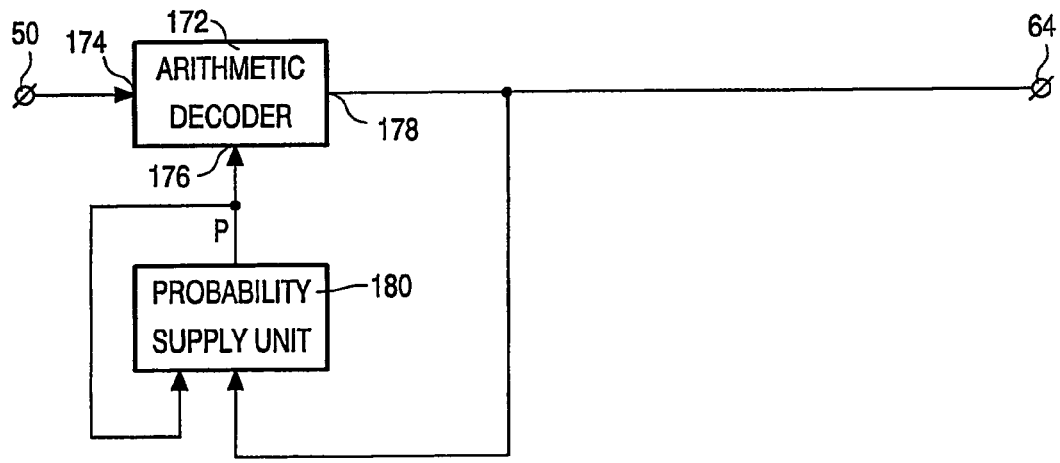
Figure 3:
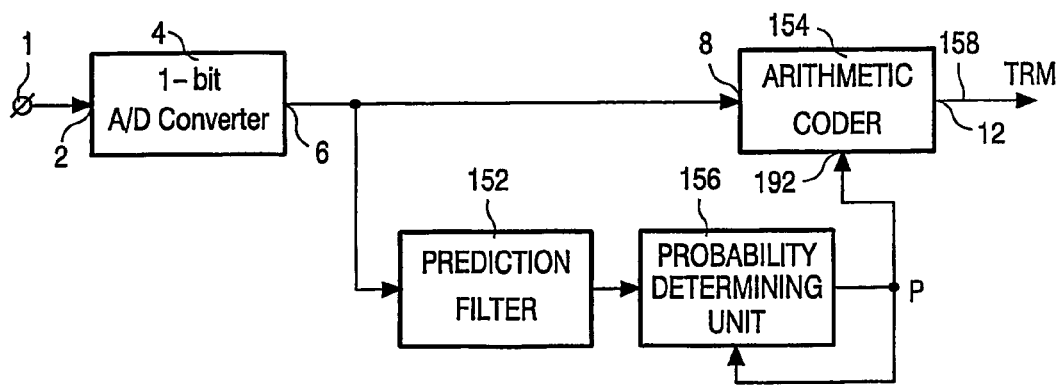
Figure 4:
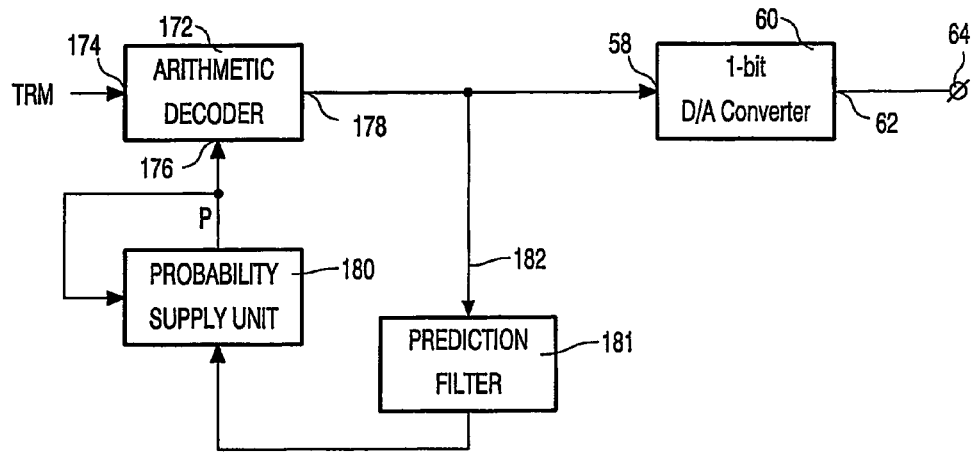
Figure 5:
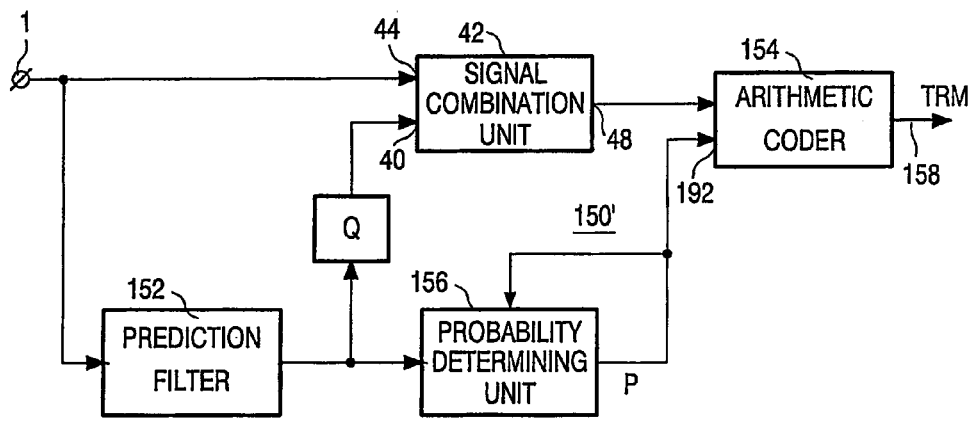
Figure 6:
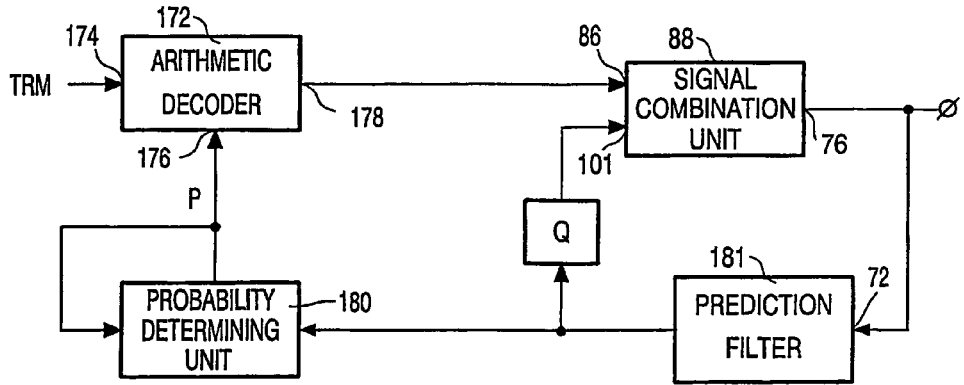
Figure 7:
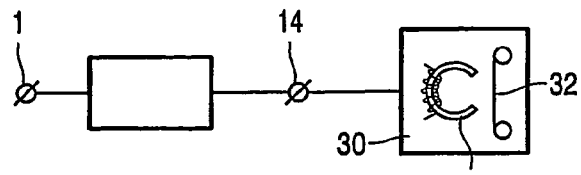
Figure 8:
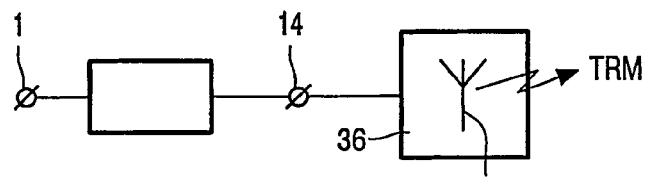
Figure 9:
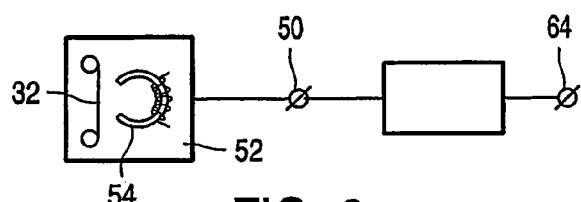
Figure 10:
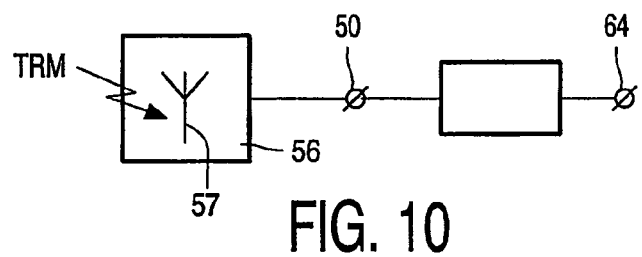
Figure 11:
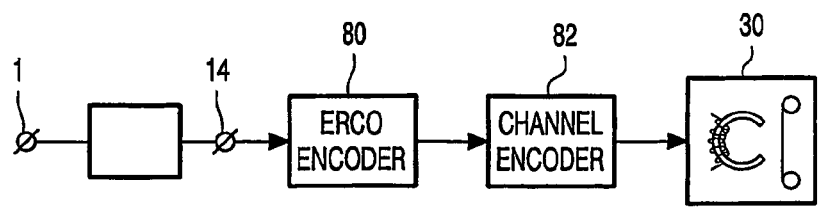
Figure 12:
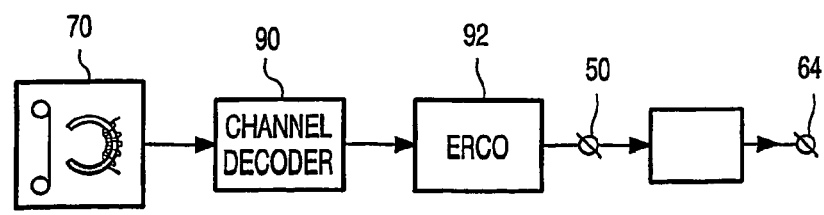

These and other aspects of the invention will be apparent from and elucidated further with reference to the embodiments described in the following figure description, in which FIG. 1 shows a first embodiment of the data compression apparatus, FIG. 2 shows a first embodiment of the data expansion apparatus, FIG. 3 shows a second embodiment of the data compression apparatus, FIG. 4 shows a second embodiment of the data expansion apparatus, FIG. 5 shows a third embodiment of the data compression apparatus, FIG. 6 shows a third embodiment of the data expansion apparatus, FIG. 7 shows the data compression apparatus incorporated in a recording apparatus for recording the data compressed signal on a record carrier, FIG. 8 shows the data compression apparatus incorporated in a transmission apparatus for transmitting the data compressed signal via a transmission medium, FIG. 9 shows the data expansion apparatus incorporated in a reproducing apparatus for reproducing the data compressed signal from a record carrier, FIG. 10 shows the data expansion apparatus incorporated in a receiving apparatus for receiving the data compressed signal from a transmission medium, FIG. 11 shows a further embodiment of the recording apparatus further provided with an error correction encoder and a channel encoder, and FIG. 12 shows a further embodiment of the reproducing apparatus further provided with a channel decoder and an error correction unit.

FIG. 1 shows an embodiment of the data compression apparatus, comprising an input terminal 1 for receiving the digital information signal. The digital information signal could be any digital signal that could be compressed by arithmetic coding, such as a digital video signal or a digital audio signal. The digital information signal is preferably in the form of a bitstream signal. The input terminal 1 is coupled to a first input 8 of a data compression unit 10 comprising an arithmetic encoder. An output 12 of the data compression unit 10 is coupled to an output terminal 14. Further the digital information signal is also an input of a probability-determining unit 156. The input terminal 1 is coupled to a first input 16 of a probability-determining unit 156. The arithmetic coder 10 encodes the bitstream signal into a data compressed signal in response to probability values P supplied to its input 192. The output of the probability-determining unit 156 is coupled to a second input 18 of the probability-determining unit 156. The probability-determining unit 156 determines a probability value indicating the probability that a bit in the bitstream signal supplied by the converter unit 4 has a predetermined logical value, such as '1'. This probability value, denoted P in FIG. 1, is supplied to the arithmetic coder 10 so as to enable the data compression of the bitstream signal in the arithmetic coder 10. The probability-determining unit 156 determines a new probability value from the digital information signal and previously determined probability values. The arithmetic coder 10 can data compress the bitstream signal on a frame-by-frame basis.

The functioning of the apparatus of FIG. 1 is as follows. The digital information signal in the present implementation in the form of a bit stream signal is supplied to the probability determining unit 156. It is determined what the probability is that the corresponding bit in the bitstream signal is eg. a '1' bit. Implementations in accordance to the invention will be described hereafter. The probabilities thus obtained for the various values in the digital input signal are subsequently supplied as the probability signal P to the arithmetic coder 10. The data compressed signal is supplied by the arithmetic coder 10 to an output terminal 14, for transmission via a transmission medium TRM or a record carrier.

Now we will describe the computations performed in the probability determining unit. The present example describes the binary case and later will be discussed an extension to the larger-alphabet case. Furthermore, is assumed that the probability value to be provided to the arithmetic coding engine is an integer number in the linear range of $0 \ldots 2^n$. Such an integer probability value is used by our multiplication-free arithmetic coding engine implementation [Vleu99, Vleu00]. For example, for n=6, a probability of 1 is represented by 64, and a probability of ½ is represented by 32. When required for a different arithmetic coding implementation, the "true" probability lying in the interval [0,1] is obtained by dividing the integer number that is derived from the probability in an arithmetic coding engine implementation by $2^n$ (or, in a practical arithmetic coding implementation using integers, the division can simply be performed by a right shift of n bits).

A way to determine the probability is to compute the running average, i.e. to store the previous $2^n$ bits and simply sum their values. The running average can be updated as each new bit is received by only a single subtraction and addition: the value of the oldest bit is subtracted from the sum and the value of the newest bit is added to the sum. A disadvantage of this method is that it requires storing potentially many previous bits (and even more information for larger alphabets). Therefore, in accordance to the invention a recursive computation that requires no storage of received bits is implemented, as will be explained in the following. The computation also offers additional flexibility for quickly exchanging accuracy for speed of adaptation.

The general form of the recursive probability computation is $$P_{k+1}(1) = c_0 \cdot P_k(1) + c_1 \cdot P_{k-1}(1) + c_2 \cdot P_{k-2}(1) + \ldots + c_u \cdot P_{k-u}(1) + d_0 \cdot b_k + d_1 \cdot b_{k-1} + d_2 \cdot b_{k-2} + \ldots + d_v \cdot b_{k-v}, \quad (2)$$

where $c_{0 \ldots u}$ and $d_{0 \ldots v}$ are constants (real numbers) and the integers u and v determine how many past inputs b or outputs P(1) are taken into account. Eq. (2) generally produces real (floating point) numbers. To lower the implementation complexity, it is often preferred to compute with integer numbers (fixed point). In that case it is assumed that the probability values range not from 0 to 1 but take on only integer values from 0 to $2^m$, where the real probability value is linearly scaled by $2^m$.

To compute the probability estimate, a preferred embodiment is the following recursive computation:

$$P_{k+1}(1) = P_k(1) - \lfloor P_k(1) \cdot 2^{-i} \rfloor + b_k \cdot 2^{m-i}, \quad (3)$$

where $P_{k+1}(1)$ and $P_k(1)$ are unsigned integers in the range $0 \ldots 2^m$ and $b_k$ is the newest input bit with a value of 0 or 1, and i ($0 \leq i \leq m/2$) is an integer determining the speed of adaptation of the probability estimate, as will be explained hereafter. ($\lfloor x \rfloor$ produces the largest integer not larger than x, i.e. it rounds x down to the nearest integer value in case it was not already an integer). The probability estimate $P_{k+1}(1)$ is used by the arithmetic encoder to compress bit $b_{k+1}$ and by the arithmetic decoder to decode this bit. The initial value, $P_0(1)$ (which is used to compress the first bit, $b_0$, can be set to correspond to any desired probability value in [0,1] by multiplying it by $2^m$; e.g. a probability of ½ corresponds to initializing as $P_0(1) = 2^{m-1}$. The computation of $\lfloor P_k(1) \cdot 2^{-i} \rfloor$ is performed in practice by shifting right the value of $P_k(1)$ by i positions, i.e. without an actual division. The multiplication of $b_k$ by $2^{m-i}$ is of course performed by shifting left its value by m−i positions. Since (3) uses only an addition and a subtraction (and some shifts) it has a much lower implementation complexity than (1), which requires a division (the complexity of dividing is much higher than that of adding or subtracting and shifting).

A lower-accuracy estimated value for P(1), in the range 0 . . . $2^n$ (n<m) can be obtained by shifting right $P_{k+1}(1)$ by m−n positions. Typical values are e.g. m=12 and n=8. Of course, instead of the truncation obtained by the simple right shift, the value for P(1) may also be obtained by rounding or "partial rounding" (which is introduced in [Vleu99, Vleu00]) of $P_{k+1}(1)/2^{m-n}$. This more accurate computation may significantly improve the accuracy for small values of n (e.g. n<5).

In the embodiment describe above, the speed of adaptation of the estimated probability value is determined by the integer i ($0 \leq i \leq m/2$). The larger the value of i, the slower the speed of adaptation.

Typically, i would be changed depending on the number of bits that have been observed or the speed at which the input probabilities for b change. For example, initially when not much data has been received yet, one can use a higher speed of adaptation to obtain a fast learning behavior and reduce this later when more data has been received to obtain a higher accuracy estimation.

To track changing statistics, one could also monitor the estimated probability value and increase accuracy when it seems to be stable and increase speed of adaptation when it seems to change. To measure change or stability, one could compute the variance of the estimate for a certain number of bits, or one could make a decision based on e.g. the magnitude of the difference between the highest and lowest estimated probability value for a certain number of bits.

The value of m depends thus not only on the required accuracy of the probability estimate (i.e. on n) but also on the required minimum adaptation speed (maximum value for i ), since the minimum adaptation speed is determined by the requirement that $i \leq m=2$ In case of multiple contexts (see e.g. [Dutt95]), each context uses its own independent probability estimator. Thus, also the accuracy and speed of adaptation can be different for each context (i.e. each context can have its own values for m and/or i; see paragraphs above).

The interface with the encoding engine is based on the highest occurring accuracy of the probability estimates (i.e. the maximal value of m across all contexts). If certain probability values have a lower accuracy, they will need to be scaled to the higher accuracy. This scaling can simply be implemented by a left shift of the estimated probability value. For example, if the accuracy of an estimate is 6 bits and the engine accepts 8 bits, the estimated value can simply be shifted left by two bits (which means that two zero bits will be appended to the estimate).

In the non-binary case, when there are N>2 different symbols, a probability is separately estimated for N−1 or all N symbols (in the latter case, the probability of the most probable symbol is adjusted so the total probability equals 1). The estimation still uses (3), but the value b=0 is now used when the occurring symbol does not equal the symbol for which the probability is estimated and the value b=1 is used when the occurring symbol does equal the symbol for which the probability is estimated. For example, when there are 4 symbols (and 4 probabilities are estimated), the value b=0 is used for three of them and b=1 is used for the symbol that actually occurs. The estimated probability values for N−1 or all N symbols have to be determined by the probability determining unit (156). In this case the new value of the probability signal comprises the estimated probability value for N−1 or all N symbols. In the event only for N−1 symbols the probability values are estimated the probability for the $N^{th}$ symbols is implicitly known and can be calculated from the N−1 estimated probability values.

FIG. 2 shows a corresponding data expansion apparatus for decoding the data compressed signal, received at input terminal 50. The data expansion apparatus of FIG. 2 comprises an entropy decoder 172, which receives the data compressed signal via an input 174. In the present example, the entropy decoder 172 is in the form of an arithmetic decoder that carries out an arithmetic decoding step on the data compressed signal under the influence of a probability signal P, supplied to an input 176 so as to generate a replica of the original digital information signal which is supplied to an output 178. The replica is supplied to an output terminal 64 of the data expansion apparatus.

Further, a probability supply unit 180 is present for supplying the probability signal P to the arithmetic decoder 172. The probability signal P can be obtained in different ways, dependent on how the probability signal has been derived in the encoder. The disclosed embodiment derives the probability signal P in an adaptive way from the output signal.

Further, the apparatus of FIG. 1 can generate parameters that describe the constants used in the formula to determine the probability signal P. Such parameters are included in the side information and transmitted to the probability supply unit 180, so as to enable the regeneration of the probability signal P in the apparatus of FIG. 2.

The entropy encoder used in the embodiment of FIG. 1 is adapted to encode the bitstream signal using a probability signal in order to obtain the data compressed signal. One such entropy encoder is the arithmetic coder described above. One other type of such entropy coder is, as an example, the well-known finite state coder. The entropy decoder used in the embodiment of FIG. 2 is adapted to decode the data compressed signal using a probability signal in order to obtain a replica of the digital information signal. One such entropy decoder is the arithmetic decoder described above. One other type of such entropy decoder is, as an example, the well-known finite state decoder.

A second embodiment of a data compression apparatus is shown in FIG. 3. In the data compression apparatus of FIG. 3, the bitstream signal is supplied to an input 8 of a lossless coder, which is in the form of an entropy coder, such as an arithmetic coder 154. Further the bitstream signal is also an input of a prediction filter unit 152. An output of the prediction filter unit 152 is coupled to an input of a probability determining unit 156. The arithmetic coder 154 encodes the bitstream signal into a data compressed bitstream signal in response to probability values p supplied to its input 192. The probability determining unit 156 determines a probability value indicating the probability that a bit in the bitstream signal supplied by the converter unit 4 has a predetermined logical value, such as '1'. This probability value, denoted p in FIG. 10, is supplied to the arithmetic coder 154 so as to enable the data compression of the bitstream signal in the arithmetic coder 154. The determining unit 156 determines this probability value from the output signal of the prediction filter 152 and a previously determined value of the probability signal. The arithmetic coder 154 can data compress the bitstream signal on a frame-by-frame basis.

The functioning of the apparatus of FIG. 3 is as follows. The prediction filter 152 realizes a prediction filtering on the bitstream signal so as to obtain a multi bit output signal. The multi bit output signal has a plurality of levels within a range of eg. +3 and −3. Further, for each of a plurality of subintervals in the value range of the multi bit output signal, it is determined what the probability is that the corresponding bit in the bitstream signal is eg. a '1' bit. This can be realized by counting the number of 'ones' and 'zeroes' occurring in the bitstream signal during a specific time interval, when the multi bit output signal falls in one of such ranges. Furthermore at least one previously determined value of the probability signal is taken into account according to one of the formulas given above. The probabilities thus obtained for the various values in the multi bit output signal are subsequently supplied as the probability signal p to the arithmetic coder 154. The data compressed bitstream signal is supplied by the arithmetic coder 154 to an output line 158, for transmission via a transmission medium TRM or a record carrier.

FIG. 4 shows a corresponding data expansion apparatus for decoding the data compressed bitstream signal, generated by an compression apparatus of FIG. 3. The data processing apparatus of FIG. 4 comprises an entropy decoder 172, which receives the data compressed bitstream signal via an input 174. In the present example, the entropy decoder 172 is in the form of an arithmetic decoder that carries out an arithmetic decoding step on the data compressed bitstream signal under the influence of a probability signal p, supplied to an input 176 so as to generate a replica of the original bitstream signal which is supplied to an output 178. The replica is supplied to an input 58 of the reconverter unit 60.

Further, a probability supply unit 180 is present for supplying the probability signal p to the arithmetic decoder 172. The probability signal p can be obtained in different ways, dependent on how the probability signal has been derived in the encoder. One way is, to derive the probability signal p in an adaptive way from the output signal of a prediction filter 181 and a previously determined value of the probability signal. In this embodiment, the prediction filter 181 is equivalent to the prediction filter 152 in the encoder and the probability supply unit 180 is equivalent to the probability determining unit 156 in the encoder of FIG. 3. Another way of generating the probability signal p, is by using side information received via the transmission medium TRM, as will be explained hereafter.

Side information can be generated by the apparatus of FIG. 3 for transmission to the apparatus of FIG. 4. Such side information can include the filter coefficients for the filter 152 that are determined on a frame by frame basis, which coefficients are transmitted to the corresponding prediction filter included in the unit 180.

Further, the apparatus of FIG. 3 can generate parameters that describe the conversion of the multi bit output signal of the prediction filter 152 into the probability signal p. Such parameters are also included in the side information and transmitted to the supply unit 180 and the filter 181, so as to enable the regeneration of the probability signal p in the apparatus of FIG. 4 on the basis of the multi bit output signal provided by the prediction filter 181.

The entropy encoder used in the embodiment of FIG. 3 is adapted to encode the bitstream signal using a probability signal in order to obtain the data compressed bitstream signal. One such entropy encoder is the arithmetic coder described above. One other type of such entropy coder is, as an example, the well known finite state coder. The entropy decoder used in the embodiment of FIG. 4 is adapted to decode the data compressed bitstream signal using a probability signal in order to obtain a replica of the bitstream signal. One such entropy decoder is the arithmetic decoder described above. One other type of such entropy decoder is, as an example, the well known finite state decoder.

A third embodiment of a data processing apparatus is shown in FIG. 5. In the data processing apparatus of FIG. 5, a bitstream signal is supplied to the input 44 of the signal combination unit 42, and via a prediction filter 181 and a quantizer Q to the input 40 of the signal combination unit 42. The quantizer Q in the current embodiment converts the multi bit output signal from the prediction filter into a binary signal. The apparatus is further provided with a data compression unit 150' which comprises an entropy encoder 154 and a probability determining unit 156. In the present example, the entropy encoder 154 is in the form of an arithmetic coder for encoding the residual bitstream signal into a data compressed residual bitstream signal in response to probability values p supplied to its input 192. The probability determining unit 156 determines a probability value indicating the probability that a bit in the residual bitstream signal supplied by the combination unit 42 has a predetermined logical value, such as '1'. This probability value, denoted p in FIG. 5, is supplied to the arithmetic coder 154 so as to enable the data compression of the residual bitstream signal in the arithmetic coder 154. The determining unit 156 determines this probability value from the output signal of the prediction filter 181. When using an arithmetic coder in the compression unit 150, the probability unit 156 could derive the probability value from the residual bitstream signal itself. In the embodiment of FIG. 5, however, the probability determining unit 156 derives the probability value from the output signal generated by the prediction filter 181 and a previously determined value of the probability signal. This has an advantage, in that a higher compression ratio can be obtained with the arithmetic coder 154. The arithmetic coder 154 can data compress the residual bitstream signal on a frame basis.

The functioning of the apparatus of FIG. 5 is as follows. The prediction filter 181 realizes a prediction filtering on the bitstream signal so as to obtain a multi bit output signal. The multi bit output signal has a plurality of levels within a range of eg. +3 and −3. A quantizer Q receives the multi bit output signal and generates a bitstream signal therefrom, eg. by allocating a bit of '1' logical value if the multi bit output signal has a positive value and allocating a bit of '0' logical value if the multi bit output signal has a negative value. Further, for each of a plurality of subintervals in the value range of the multi bit output signal, it is determined what the probability is that the corresponding bit in the residual signal is eg. a '1' bit. This can be realized by counting the number of 'ones' and 'zeroes' occurring in the residual bitstream signal during a specific time interval, when the multi bit output signal falls in one of such ranges. Furthermore, to determine a new value of the probability signal a previously determined value of the probability value is taken into account according to the formulas given above. The probabilities thus obtained for the various values in the multi bit output signal is subsequently supplied as the probability signal p to the arithmetic coder 154. The data compressed residual bitstream signal is supplied by the arithmetic coder 154 to an output line 158, for transmission via a transmission medium TRM.

FIG. 6 shows a corresponding data processing apparatus for decoding the data compressed residual bitstream signal, generated by a data compression apparatus according to FIG. 5. The data processing apparatus of FIG. 6 comprises an entropy decoder 172, which receives the data compressed residual bitstream signal via an input 174. In the present example, the entropy decoder 172 is in the form of an arithmetic decoder that carries out an arithmetic decoding step on the data compressed bitstream signal under the influence of a probability signal p, supplied to an input 176 so as to generate a replica of original residual bitstream signal which is supplied to an output 178. The replica is supplied to an input 86 of the signal combination unit 88. The signal combination unit 88 further receives a predicted version of the bitstream signal via the input 101 and generates the replica of the original bitstream signal at its output 76. The output 76 is coupled via a prediction filter 181 and a quantizer Q to the input 101 of the signal combination unit 88. The functioning of the prediction filter 74' and the quantizer Q can be identical to the functioning of the prediction filter 10' and the quantizer Q in FIG. 5, that is: the prediction filter 181 derives its filter coefficients from the input signal it receives via its input 72. In another embodiment, the prediction filter 181 receives the filter coefficients from side information received via the transmission medium TRM from the encoder apparatus of FIG. 5, as will be explained below.

Further, a probability generation unit 180 is present for supplying the probability signal p to the arithmetic decoder 172. The probability signal p can be obtained in different ways. One way is, to derive the probability signal p from the output signal of the prediction filter 181, in the same way as the probability determining unit 156 determines then probability signal p from the prediction filter 152 in FIG. 5. In such situation, the supply unit 180 in FIG. 6 can be identical to the determining unit 156 in FIG. 5, and the supply unit 180 has an input coupled to the output of the prediction filter 181. Another way of generating the probability signal p, is by using side information received via the transmission medium TRM, as will be explained hereafter.

Side information can be generated by the apparatus of FIG. 5 for transmission to the apparatus of FIG. 6. Such side information can include the filter coefficients for the filter 152 that are determined on a frame by frame basis, which coefficients are transmitted to the filter 181 for setting the correct filter characteristic of the filter 181. Further, the apparatus of FIG. 5 can generate parameters that describe the conversion of the multi bit output signal of the prediction filter 152 into the probability signal p. Such parameters are also included in the side information and transmitted to the probability determining unit 180, so as to enable the regeneration of the probability signal p in the apparatus of FIG. 6.

The entropy encoder used in the embodiment of FIG. 5 is adapted to encode the residual bitstream signal using a probability signal in order to obtain the data compressed residual bitstream signal. One of such entropy encoder is the arithmetic coder described above. One other type of such entropy coder is, as an example, the well known finite state coder. The entropy decoder used in the embodiment of FIG. 20 is adapted to decode the data compressed residual bitstream signal using a probability signal in order to obtain a replica of the residual bitstream signal. One of such entropy decoder is the arithmetic decoder described above. One other type of such entropy decoder is, as an example, the well known finite state decoder.

FIG. 7 shows an embodiment of a recording apparatus comprising the data compression apparatus shown in FIG. 1, 3 or 5. The recording apparatus further comprises a write unit 30 for writing the data compressed signal in a track on the record carrier 32. In the present example, the record carrier 32 is a magnetic record carrier, so that the write unit 30 comprises at least one magnetic head 34 for writing the data compressed signal in the record carrier 32. The record carrier may however be an optical record carrier, such as a CD disk or a DVD disk.

FIG. 8 shows an embodiment of a transmitter for transmitting a digital information signal via a transmission medium TRM, comprising the data compression apparatus as shown in FIG. 1, 3 or 5. The transmitter further comprises a transmission unit 36 for applying the data compressed signal to the transmission medium TRM. The transmission unit 36 could comprise an antenna 38.

Transmission via a transmission medium, such as a radio frequency link or a record carrier, generally requires an error correction encoding and a channel encoding carried out on the data compressed signal to be transmitted. FIG. 11 shows such signal processing steps carried out on the data compressed signal for the recording arrangement of FIG. 7. The recording arrangement of FIG. 11 therefore comprises an error correction encoder 80, well known in the art, and a channel encoder 82, also well known in the art.

FIG. 9 shows the data expansion apparatus of FIG. 2, 4 or 6 incorporated in a reproduction apparatus. The reproducing apparatus further comprises a read unit 52 for reading the data compressed signal from a track on the record carrier 32. In the present example, the record carrier 32 is a magnetic record carrier, so that the read unit 52 comprises at least one magnetic head 54 for reading the data compressed signal from the record carrier 32. The record carrier may however be an optical record carrier, such as a CD disk or a DVD disk so that the read unit is an optical pickup unit.

FIG. 10 shows an embodiment of a receiver for receiving a digital information signal via a transmission medium TRM, comprising the data expansion apparatus as shown in FIG. 2, 4 or 6. The receiver further comprises a receiving unit 56 for receiving the data compressed signal from the transmission medium TRM. The receiving unit 56 could comprise an antenna 57.

As has been explained above, transmission via a transmission medium, such as a radio frequency link or a record carrier, generally requires an error correction encoding and a channel encoding carried out on the data compressed signal to be transmitted, so that a corresponding channel decoding and error correction can be carried out upon reception. FIG. 8 shows the signal processing steps of channel decoding and error correction carried out on the received signal, received by the reading means 56 for the reproducing arrangement of FIG. 9. The reproducing arrangement of FIG. 12 therefore comprise a channel decoder 90, well known in the art, and an error correction unit 92, also well known in the art, so as to obtain a replica of the data compressed signal.

The embodiments given are adapted to process a bitstream signal. It should be noted that the invention could also be used in apparatuses for data compression/expanding of an n-level information signal. The prediction filterr realizes than a prediction on a n-level information signal so as to obtain a multi value output signal. The quantizer is adapted to quantize the multi value output signal so as to obtain a n-level quantized information signal. The signal combination unit, if present, is adapted to combine the n-level information signal and the n-level quantized signal so as to obtain a n-level residual information signal. The combination can be implemented in adding or subtracting the two n-level information signal received at the corresponding inputs. The probability determining unit generates a probability value indication the probability that a value of the residual information signal has a predetermined value, such as '+2'. This probability is supplied to the arithmetic coder so as to enable the data compression of the n-level information signal, which could be a residual signal, in the arithmetic coder. In this embodiment a value of the probability signal consists of a value for each of the n possible values of the n-level information signal. An n-level information signal with 256 levels could be represented by a 8-bit information signal.

Whilst the invention has been described with reference to preferred embodiments thereof, it is to be understood that these are not limitative examples. Thus, various modifications may become apparent to those skilled in the art, without departing from the scope of the invention, as defined by the claims. When the digital information signal is supplied in digital form, such as sampled at 44.1 kHz and the samples being expressed in eg. 16 bits, the apparatus might comprise conversion means adapted to oversample the digital audio signal with eg. the frequency of 64×44.1 kHz so as to obtain the 1-bit bitstream signal.

It should further be noted that the invention also applies to an embodiment in which the bitstream signal, as supplied by the converter 4 has undergone an additional signal processing step resulting in a processed 1-bit bitstream signal that is supplied to the entropy encoder 10 and the probability determining unit 156. Such additional signal processing step could include merging a left and right hand signal component of a stereo audio signal, in 1-bit bitstream form, into a processed 1-bit bitstream signal.

Further, the invention lies in each and every novel feature or combination of features.

LIST OF RELATED DOCUMENTS

[Dutt95] D. L. Duttweiler and C. Chamzas, "Probability estimation in arithmetic and adaptive-Huffman entropy coders," *IEEE Trans. Image Processing*, vol. 4, pp. 237-246, March 1995.

[Lang84] G. G. Langdon, Jr., "An introduction to arithmetic coding," *IBM J. Res. Develop.*, vol. 28, pp. 135-149, March 1984.

[Moff98] A. Moffat, R. M. Neal, and I. H. Witten, "Arithmetic coding revisited," *ACM Trans. Information Systems*, vol. 16, pp. 256-294, July 1998.

[Mohi87] K. M. A. Mohiuddin and J. J. Rissanen, *Multiplication-free multi-alphabet arithmetic code*, 1987. U.S. Pat. No. 4,652,856.

[Penn88] W. B. Pennebaker, J. L. Mitchell, G. G. Langdon, Jr., and R. B. Arps, "An overview of the basic principles of the Q-Coder adaptive binary arithmetic coder," *IBM J. Res. Develop.*, vol. 32, pp. 717-726, November 1988.

[Penn93] W. B. Pennebaker and J. L. Mitchell, *JPEG Still Image Data Compression Standard*. New York, N.Y.: Van Nostrand Reinhold, 1993.

[Riss89] J. Rissanen and K. M. Mohiuddin, "A multiplication-free multialphabet arithmetic code," *IEEE Trans. Commun.*, vol. 37, pp. 93-98, February 1989.

[Vleu98a] R. J. van der Vleuten and F. Bruekers, "Lossless compression of binary audio signals," in *Data Compression Conference (DCC '98)*, (Snow-bird, UT), p. 579, Mar. 30-Apr. 1, 1998.

[Vleu98b] R. J. van der Vleuten and A. A. M. L. Bruekers, "Modeling binary audio signals for lossless compression," in *Nineteenth Symp. Inform. Theory in the Benelux*, (Veldhoven, The Netherlands), pp. 135-142, May 28-29, 1998.

[Vleu99] R. J. van der Vleuten, "New methods for multiplication-free arithmetic coding," in *Data Compression Conference (DCC '99)*, (Snow-bird, UT), p. 555, Mar. 29-31, 1999.

[Vleu00] R. J. van der Vleuten, *Arithmetic encoding and decoding of an information signal*, 2000. U.S. Pat. No. 6,144,320.

[Vleu01] R. J. van der Vleuten, A. A. M. L. Bruekers, and A. W. J. Oomen, *Data Processing of a bitstream signal*, 2001. U.S. Pat. No. 6,289,306B1.

[Witt87] I. H. Witten, R. M. Neal, and J. G. Cleary, "Arithmetic coding for data compression," *Communications ACM*, vol. 30, pp. 520-540, June 1987.

The invention claimed is:

1. Data compression apparatus for data compressing a digital information signal, the data compression apparatus comprising input means for receiving the digital information signal, probability signal determining means for determining a probability signal from the digital information signal, entropy encoding means for entropy encoding the digital information signal in response to said probability signal so as to obtain a data compressed digital information signal, and output means for supplying the data compressed digital information signal, characterized in that the probability signal determining means is adapted for determining a new value of said probability signal from the digital information signal and at least one previously determined value of said probability signal.

2. Apparatus as claimed in claim 1, characterized in that the probability signal determining means is adapted to perform the following computation:

$$P_{k+1}(1) = P_k(1) - \lfloor P_k(1)/2^{-i} \rfloor + b_k \cdot 2^{m-i},$$

where $P_{k+1}(1)$ and $P_k(1)$ are unsigned integers in the range $0 \ldots 2^m$ and $b_k$ is the newest input bit with a value of 0 or 1, and i is an integer in the range $0 \leq i \leq m/2$ and m is an integer >1.

3. Transmitter for transmitting a digital information signal via a transmission medium, comprising the data compression apparatus as claimed in anyone of the claims 1 to 2, wherein the transmitter further comprises transmission means for applying the data compressed digital information signal to the transmission medium.

4. Transmitter as claimed in claim 3, wherein the transmitter further comprises error correction encoding means and/or channel encoding means, for error correction encoding and/or channel encoding the data compressed digital information signal prior to applying the data compressed digital information signal to the transmission medium.

5. Recording apparatus for recording a digital information signal on a record carrier, comprising the data compression apparatus as claimed in anyone of the claims 1 to 2, wherein the recording apparatus further comprises writing means for writing the data compressed signal in a track on the record carrier.

6. Recording apparatus as claimed in claim 5, wherein the record carrier is an optical or a magnetic record carrier.

7. Recording apparatus as claimed in claim 5, further comprising error correction encoding means and/or channel encoding means, for error correction encoding and/or channel encoding the data compressed digital information signal prior to writing the data compressed digital information signal on the record carrier.

8. Method for data compressing a digital information signal, the method comprising the steps of:

receiving the digital information signal, determining a probability signal from the digital information signal, entropy encoding the digital information signal in response to said probability signal so as to obtain so as to obtain a data compressed digital information signal, and supplying the data compressed digital information signal, characterized in that the probability determining step is adapted to determine a new value of said probability signal from the digital information signal and at least one previously determined value of said probability signal.

9. Record carrier having a data compressed digital information signal recorded on it in a track of said record carrier, the data compressed digital information signal being obtained by the method according to claim 8.

10. Data expansion apparatus for data expanding a data compressed digital information signal so as to obtain a replica of an original digital information signal, the data expansion apparatus comprising
    input means for receiving the data compressed digital information signal,
    entropy decoding means for entropy decoding the data compressed digital information signal in response to a probability signal so as to obtain said replica,
    probability signal determining means for generating said probability signal from said replica,
    output means for supplying replica, characterized in that said probability signal determining means are adapted to determine a new value of said probability signal from the replica and at least one previously determined value of said probability signal.

11. Apparatus as claimed in claim 10, characterized in that the probability signal determining means is adapted to perform the following computation:

$$P_{k+1}(1) = P_k(1) - \lfloor P_k(1)/2^{-i} \rfloor + b_k \cdot 2^{m-i},$$

where $P_{k+1}(1)$ and $P_k(1)$ are unsigned integers in the range $0 \ldots 2^m$ and $b_k$ is the newest input bit with a value of 0 or 1, and i is an integer in the range $0 \leq i \leq m/2$ and m is an integer $>1$.

12. Receiver for receiving an digital information signal via a transmission medium, comprising the data expansion apparatus as claimed in anyone of the claims 10 to 11, wherein the receiver further comprises
    receiving means for retrieving the data compressed signal from the transmission medium.

13. Receiver as claimed in claim 12, wherein the receiver further comprises channel decoding means and/or error correction means, for channel decoding and/or error correcting the signal retrieved from the transmission medium so as to obtain said data compressed signal.

14. Reproducing apparatus for reproducing a digital information signal from a record carrier, comprising the data expansion apparatus as claimed in anyone of the claims 10 to 11, wherein the reproducing apparatus further comprises
    reading means for reading the data compressed signal from a track on the record carrier.

15. Reproducing apparatus as claimed in claim 14, further comprising channel decoding means and/or error correction means, for channel decoding and/or correcting the signal read from the record carrier so as to obtain said data compressed signal.

16. Data expansion method for data expanding a data compressed digital information signal so as to obtain a replica of an original digital information signal, the data expansion method comprising the steps of:
    receiving the data compressed digital information signal,
    entropy decoding the data compressed digital information signal in response to a probability signal so as to obtain said replica,
    generating said probability signal from said replica,
    supplying replica, characterized in that said probability signal determining step is adapted to determine a new value of said probability signal from the replica and at least one previously determined value of said probability signal.

* * * * *